United States Patent
Nakazono

(10) Patent No.: US 10,512,201 B2
(45) Date of Patent: Dec. 17, 2019

(54) MEMBER PREPARATION METHOD AND MEMBER PREPARATION APPARATUS

(71) Applicant: Panasonic Intellectual Property Management Co., Ltd., Osaka (JP)

(72) Inventor: Atsushi Nakazono, Kanagawa (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 114 days.

(21) Appl. No.: 15/909,134

(22) Filed: Mar. 1, 2018

(65) Prior Publication Data
US 2018/0279523 A1 Sep. 27, 2018

(30) Foreign Application Priority Data

Mar. 23, 2017 (JP) ................................. 2017-057069
Mar. 23, 2017 (JP) ................................. 2017-057070

(51) Int. Cl.
*H05K 13/08* (2006.01)
*G05B 19/4065* (2006.01)
*H05K 13/04* (2006.01)

(52) U.S. Cl.
CPC ......... *H05K 13/08* (2013.01); *G05B 19/4065* (2013.01); *H05K 13/0408* (2013.01); *H05K 13/087* (2018.08); *H05K 13/0895* (2018.08)

(58) Field of Classification Search
CPC ........... G05B 19/4065; H05K 13/0408; H05K 13/08; H05K 13/087; H05K 13/0895
See application file for complete search history.

(56) References Cited

U.S. PATENT DOCUMENTS

2009/0241326 A1* 10/2009 Ieizumi .............. H05K 13/0853
                                                                   29/739
2015/0148934 A1    5/2015 Maenishi et al.

FOREIGN PATENT DOCUMENTS

JP      2013-098360 A  * 11/2011  ............. H05K 13/02
JP      5807158 B2       11/2015
JP      5945690 B2        7/2016

OTHER PUBLICATIONS

Ayob et al. "Component Pick-and-Place Scheduling using a Weighted Nozzle Rank Approach" Aug. 17, 2005, pp. 1-7. (Year: 2005).*

* cited by examiner

*Primary Examiner* — Kenneth M Lo
*Assistant Examiner* — Chad G Erdman
(74) *Attorney, Agent, or Firm* — Pearne & Gordon LLP

(57) ABSTRACT

A member preparation method includes a request rank determining step of determining a request member rank of a member fitted to production of a mounting board based on board information and component information including a mounting position of a component mounted on the mounting board. Furthermore, the member preparation method includes a fitting member extracting step of extracting a fitting member fitted to the request member rank in a plurality of members based on a production plan of the mounting board and retained member information in which a member rank is associated with each of the plurality of the members. Furthermore, the member preparation method includes a use member selecting step of selecting a use member in the fitting member, and a member preparation instructing step of generating an instruction to prepare the use member.

12 Claims, 16 Drawing Sheets

FIG. 5

| COMPONENT INFORMATION Ida(Idb) | | | | | | | | | | | | |
|---|---|---|---|---|---|---|---|---|---|---|---|---|
| COMPONENT NAME | SHAPE | SIZE | REQUEST MEMBER RANK | | | | | | | | | |
| | | | SUCTION NOZZLE | | | TAPE FEEDER | | | MOUNTING HEAD | | | |
| | | | Excellent | Good | Bad | Excellent | Good | Bad | Excellent | Good | Bad | |
| PA01 | NORMAL | 0201 | Yes | No | No | Yes | No | No | Yes | No | No | |
| PA02 | NORMAL | 0201 | Yes | No | No | Yes | No | No | Yes | No | No | |
| PA03 | NORMAL | 0402 | Yes | No | No | Yes | No | No | Yes | No | No | |
| PA04 | NORMAL | 0603 | Yes | Yes | No | Yes | Yes | No | Yes | Yes | No | |
| PA05 | NORMAL | 1005 | Yes | Yes | No | Yes | Yes | No | Yes | Yes | No | |
| PA06 | SPECIAL | 1608 | Yes | Yes | No | Yes | Yes | No | Yes | Yes | No | |
| PA07 | SPECIAL | 2010 | Yes | Yes | Yes | Yes | Yes | Yes | Yes | Yes | Yes | |
| PA08 | SPECIAL | 3216 | Yes | Yes | Yes | Yes | Yes | Yes | Yes | Yes | Yes | |
| ... | ... | ... | ... | ... | ... | ... | ... | ... | ... | ... | ... | |
| 71 | 72 | 73 | 74a | 74b | 74c | 75a | 75b | 75c | 76a | 76b | 76c | |

FIG. 6A

| ITEM (81) | RANK CLASSIFICATION INFORMATION (MEMBER STATE RANK) | lr1 |
|---|---|---|
| | (a) CUMULATIVE USE TIME | MEMBER STATE RANK |
| | (b) NUMBER OF TIMES OF MAINTENANCE | |
| | (c) ELAPSED TIME AFTER LAST MAINTENANCE | |
| | ALL ITEMS ARE WITHIN THRESHOLD (82) | Excellent (83) |
| | ONE ITEM IS OUT OF THRESHOLD | Good |
| | TWO ITEMS ARE OUT OF THRESHOLD | Bad |
| | ALL ITEMS ARE OUT OF THRESHOLD | Disabled |

FIG. 6B

| ITEM (84) | RANK CLASSIFICATION INFORMATION (MEMBER QUALITY RANK) | lr2 |
|---|---|---|
| | (d) ERROR RATE PER NUMBER OF TIMES OF COMPONENT MOUNTING PROCESS | MEMBER QUALITY RANK |
| | (e) ERROR RATE PER USE PERIOD OF MEMBER | |
| | (f) EVALUATION INFORMATION OF MEMBER | |
| | ALL ITEMS ARE WITHIN THRESHOLD (85) | Excellent (86) |
| | ONE ITEM IS OUT OF THRESHOLD | Good |
| | TWO ITEMS ARE OUT OF THRESHOLD | Bad |
| | ALL ITEMS ARE OUT OF THRESHOLD | Disabled |

FIG. 7

RETAINED MEMBER INFORMATION (SUCTION NOZZLE) — Ica1(Icb1)

| NUMBER OF NOZZLE | TYPE OF NOZZLE | CORRESPONDING COMPONENT SHAPE | CORRESPONDING COMPONENT SIZE | CORRESPONDING MOUNTING INTERVAL (mm) | MEMBER STATE RANK | MEMBER QUALITY RANK | MEMBER RANK |
|---|---|---|---|---|---|---|---|
| NA01 | NA | NORMAL | 0201 | 0.05- | Excellent | Excellent | Excellent |
| NA02 | NA | NORMAL | 0201 | 0.05- | Good | Excellent | Good |
| NB01 | NB | NORMAL | 0201-0402 | 0.1- | Excellent | Excellent | Excellent |
| NC01 | NC | NORMAL | 0603-1005 | 0.3- | Bad | Good | Bad |
| ND01 | ND | SPECIAL | 1608-3216 | 0.5- | Bad | Disabled | Disabled |
| ... | ... | ... | ... | ... | ... | ... | ... |

RETAINED MEMBER INFORMATION (TAPE FEEDER) — Ica2(Icb2)

| NUMBER OF FEEDER | TYPE OF FEEDER | CORRESPONDING TAPE SIZE | MEMBER STATE RANK | MEMBER QUALITY RANK | MEMBER RANK |
|---|---|---|---|---|---|
| FA01 | FA | 8mm | Excellent | Excellent | Excellent |
| FA02 | FA | 8mm | Good | Excellent | Good |
| FA03 | FA | 8mm | Excellent | Excellent | Excellent |
| FA04 | FA | 8mm | Bad | Good | Bad |
| FB01 | FB | 16mm | Excellent | Good | Good |
| ... | ... | ... | ... | ... | ... |

RETAINED MEMBER INFORMATION (MOUNTING HEAD) — Ica3(Icb3)

| NUMBER OF HEAD | TYPE OF HEAD | NUMBER OF NOZZLE | CORRESPONDING COMPONENT SIZE | MEMBER STATE RANK | MEMBER QUALITY RANK | MEMBER RANK |
|---|---|---|---|---|---|---|
| HA01 | HA | 16 | 0201- | Excellent | Excellent | Excellent |
| HB01 | HB | 3 | 0603- | Good | Excellent | Good |
| ... | ... | ... | ... | ... | ... | ... |
| ↑ 111 | ↑ 112 | ↑ 113 | ↑ 114 | ↑ 115 | ↑ 116 | ↑ 117 |

FIG. 10

REQUEST RANK INFORMATION — Ial

| COMPONENT NAME | SHAPE | SIZE | MINIMUM MOUNTING INTERVAL (mm) | NUMBER OF COMPONENTS | REQUEST MEMBER RANK ||| 
|---|---|---|---|---|---|---|---|
| | | | | | SUCTION NOZZLE | TAPE FEEDER | MOUNTING HEAD |
| PA01 | NORMAL | 0201 | 0.05 | 2 | Excellent | Excellent | Excellent |
| PA02 | NORMAL | 0201 | 0.15 | 4 | Excellent | Excellent | Excellent |
| PA03 | NORMAL | 0402 | 0.20 | 5 | Excellent | Excellent | Excellent |
| PA08 | SPECIAL | 3216 | 2.0 | 1 | Bad | Bad | Bad |
| ... | ... | ... | ... | ... | ... | ... | ... |
| ↑ 121 | ↑ 122 | ↑ 123 | ↑ 124 | ↑ 125 | ↑ 126 | ↑ 127 | ↑ 128 |

FIG. 11

| FITTING MEMBER INFORMATION (SUCTION NOZZLE) | | | | lad1 |
|---|---|---|---|---|
| COMPONENT NAME | NUMBER OF NOZZLE | TYPE OF NOZZLE | REQUEST MEMBER RANK | MEMBER RANK |
| PA01 | NA01 | NA | Excellent | Excellent |
| | NA02 | NA | Excellent | Good |
| PA02 | NA01 | NA | Excellent | Excellent |
| | NA02 | NA | Excellent | Good |
| | NB01 | NB | Excellent | Excellent |
| PA03 | NB01 | NB | Excellent | Excellent |
| PA08 | ND01 | ND | Bad | Disabled |
| ... | ... | ... | ... | ... |
| ↑ | ↑ | ↑ | ↑ | ↑ |
| 131 | 132 | 133 | 134 | 135 |

FIG. 12

| FITTING MEMBER INFORMATION (TAPE FEEDER) — lad2 | | | | |
|---|---|---|---|---|
| COMPONENT NAME | NUMBER OF FEEDER | TYPE OF FEEDER | REQUEST MEMBER RANK | MEMBER RANK |
| PA01 | FA01 | FA | Excellent | Excellent |
| | FA02 | FA | Excellent | Good |
| | FA03 | FA | Excellent | Excellent |
| | FA04 | FA | Excellent | Bad |
| PA02 | FA01 | FA | Excellent | Excellent |
| | FA02 | FA | Excellent | Good |
| | FA03 | FA | Excellent | Excellent |
| | FA04 | FA | Excellent | Bad |
| PA03 | FA01 | FA | Excellent | Excellent |
| | FA02 | FA | Excellent | Good |
| | FA03 | FA | Excellent | Excellent |
| | FA04 | FA | Excellent | Bad |
| PA08 | FA01 | FA | Bad | Excellent |
| | FA02 | FA | Bad | Good |
| | FA03 | FA | Bad | Excellent |
| | FA04 | FA | Bad | Bad |
| ... | ... | ... | ... | ... |
| ↑ 141 | ↑ 142 | ↑ 143 | ↑ 144 | ↑ 145 |

FIG. 13

| FITTING MEMBER INFORMATION (MOUNTING HEAD) | | | | | — lad3 |
|---|---|---|---|---|
| COMPONENT NAME | NUMBER OF HEAD | TYPE OF HEAD | REQUEST MEMBER RANK | MEMBER RANK |
| PA01 | HA01 | HA | Excellent | Excellent |
| PA02 | HA01 | HA | Excellent | Excellent |
| PA03 | HA01 | HA | Excellent | Excellent |
| PA08 | HA01 | HA | Excellent | Excellent |
|  | HB01 | HB | Bad | Good |
| ... | ... | ... | ... | ... |

USE MEMBER INFORMATION (SUCTION NOZZLE) — lsd1

| NUMBER OF NOZZLE | TYPE OF NOZZLE | REQUEST MEMBER RANK | MEMBER RANK |
|---|---|---|---|
| NA01 | NA | Excellent | Excellent |
| NA02 | NA | Excellent | Good |
| NB01 | NB | Excellent | Excellent |
| ND01 | ND | Bad | Disabled |
| ... | ... | ... | ... |
| ↑ 161 | ↑ 162 | ↑ 163 | ↑ 164 |

FIG. 14B

USE MEMBER INFORMATION (TAPE FEEDER) — lsd2

| NUMBER OF FEEDER | TYPE OF FEEDER | REQUEST MEMBER RANK | MEMBER RANK |
|---|---|---|---|
| FA01 | FA | Excellent | Excellent |
| FA02 | FA | Excellent | Good |
| FA03 | FA | Excellent | Excellent |
| FA04 | FA | Bad | Bad |
| ... | ... | ... | ... |
| ↑ 165 | ↑ 166 | ↑ 167 | ↑ 168 |

FIG. 14C

USE MEMBER INFORMATION (MOUNTING HEAD) — lsd3

| NUMBER OF HEAD | TYPE OF HEAD | REQUEST MEMBER RANK | MEMBER RANK |
|---|---|---|---|
| HA01 | HA | Excellent | Excellent |
| ... | ... | ... | ... |
| ↑ 169 | ↑ 170 | ↑ 171 | ↑ 172 |

FIG. 15

| PREPARATION INSTRUCTING INFORMATION | | | Pea(Peb,Pec) |
|---|---|---|
| NUMBER OF MEMBER | TYPE OF MEMBER | REQUEST MEMBER RANK |
| NA01 | NA | Excellent |
| NA02 | NA | Excellent |
| NB01 | NB | Excellent |
| ND01 | ND | Bad |
| ... | ... | ... |
| FA01 | FA | Excellent |
| FA02 | FA | Excellent |
| FA03 | FA | Excellent |
| FA04 | FA | Bad |
| ... | ... | ... |
| HA01 | HA | Excellent |
| ... | ... | ... |

| UNDER RANKED MEMBER INFORMATION (SUCTION NOZZLE) | | | lud1 |
|---|---|---|---|
| NUMBER OF NOZZLE | TYPE OF NOZZLE | REQUEST MEMBER RANK | MEMBER RANK |
| NA02 | NA | Excellent | Good |
| ND01 | ND | Bad | Disabled |
| ... | ... | ... | ... |
| ↑ 191 | ↑ 192 | ↑ 193 | ↑ 194 |

FIG. 16B

| UNDER RANKED MEMBER INFORMATION (TAPE FEEDER) | | | lud2 |
|---|---|---|---|
| NUMBER OF FEEDER | TYPE OF FEEDER | REQUEST MEMBER RANK | MEMBER RANK |
| FA02 | FA | Excellent | Good |
| ... | ... | ... | ... |
| ↑ 195 | ↑ 196 | ↑ 197 | ↑ 198 |

FIG. 16C

| UNDER RANKED MEMBER INFORMATION (MOUNTING HEAD) | | | lud3 |
|---|---|---|---|
| NUMBER OF HEAD | TYPE OF HEAD | REQUEST MEMBER RANK | MEMBER RANK |
| ... | ... | ... | ... |
| ↑ 199 | ↑ 200 | ↑ 201 | ↑ 202 |

FIG. 17

| PROCESSING INSTRUCTION INFORMATION | | | | Pma(Pmb,Pmc) |
|---|---|---|---|---|
| NUMBER OF MEMBER | TYPE OF MEMBER | REQUEST MEMBER RANK | MEMBER RANK | COMPLETION EXPECTED DATE AND TIME |
| NA01 | NA | Excellent | Good | 2017/03/10 10:00 |
| ND01 | ND | Bad | Disabled | 2017/03/10 10:00 |
| ... | ... | ... | ... | ... |
| FA02 | FA | Excellent | Good | 2017/03/10 10:00 |
| ... | ... | ... | ... | ... |
| ↑ | ↑ | ↑ | ↑ | ↑ |
| 211 | 212 | 213 | 214 | 215 |

MEMBER PREPARATION METHOD AND MEMBER PREPARATION APPARATUS

BACKGROUND

1. Technical Field

The present disclosure relates to a member preparation method of a member which is used for the production of a mounting board in which a component is mounted on a board and a member preparation apparatus.

2. Description of the Related Art

Members such as a suction nozzle that sucks a component, a mounting head in which the suction nozzle is installed, a tape feeder (component supplier) that supplies a component from a carrier tape for storing the component, and the like are installed on a mounting machine, which produces a mounting board in which the component is mounted on the board, to be used. These members are consumable materials that are used for a long period of time while performing maintenance and mounting accuracy varies depending on a use time, a maintenance condition, or the like (for example, see Japanese Patent No. 5807158 (PTL 1)). In PTL 1, a rank of the mounting accuracy of the tape feeder and the suction nozzle is calculated from a process capability index based on a suction position shifting amount of a component picked up from the tape feeder and held in the suction nozzle, and maintenance is executed when the rank drops.

In addition, respective members are commonly used in a plurality of mounting machines that produce mounting boards in parallel and are used in combination as appropriate according to the mounting board to be produced (for example, see Japanese Patent No. 5945690 (PTL 2)). In PTL 2, a member to be used for production of the mounting board that is a new production target is prepared based on a production plan of the mounting board and an inventory situation of a member.

SUMMARY

A member preparation method of the disclosure includes a request rank determining step, a fitting member extracting step, a use member selecting step, and a member preparation instructing step.

The request rank determining step determines a request member rank of a member fitted to production of a mounting board based on board information including a mounting position of a component mounted on the mounting board and component information of the component mounted on the mounting board.

The fitting member extracting step extracts a fitting member fitted to the request member rank determined in the request rank determining step in a plurality of members based on a production plan of the mounting board and retained member information in which a member rank is associated with each of the plurality of the members usable in the production of the mounting board.

The use member selecting step selects a use member that is used for the production of the mounting board from the fitting member extracted in the fitting member extracting step.

The member preparation instructing step generates an instruction to prepare the use member selected in the use member selecting step.

A member preparation apparatus of the disclosure includes a production information acquiring unit, a request rank determination unit, a fitting member extracting unit, a use member selector, and a member preparation instructing unit.

The production information acquiring unit acquires board information including a mounting position of a component mounted on a mounting board, component information of the component mounted on the mounting board, a production plan of the mounting board, and retained member information in which a member rank is associated with each of a plurality of the members usable in production of the mounting board.

The request rank determination unit determines a request member rank of a member fitted to production of the mounting board based on the board information and the component information acquired by the production information acquiring unit.

The fitting member extracting unit extracts a fitting member fitted to the request member rank determined by the request rank determination unit in the plurality of members based on the production plan and the retained member information acquired by the production information acquiring unit.

The use member selector selects a use member that is used for the production of the mounting board from the fitting member extracted by the fitting member extracting unit.

The member preparation instructing unit generates an instruction to prepare the use member selected by the use member selector.

BRIEF DESCRIPTION OF THE DRAWINGS

FIG. 5 is an explanatory view of a configuration of an example of component information used in the component mounting system of the exemplary embodiment;

FIG. 6A is an explanatory view of a configuration of an example of rank classification information used in the component mounting system of the exemplary embodiment;

FIG. 6B is an explanatory view of a configuration of an example of rank classification information used in the component mounting system of the exemplary embodiment;

FIG. 7 is an explanatory view of a configuration of an example of retained member information used in the component mounting system of the exemplary embodiment;

FIG. 8 is an explanatory view of a configuration of an example of the retained member information used in the component mounting system of the exemplary embodiment;

FIG. 9 is an explanatory view of a configuration of an example of the retained member information used in the component mounting system of the exemplary embodiment;

FIG. 10 is an explanatory view of a configuration of an example of request rank information used in the component mounting system of the exemplary embodiment;

FIG. 11 is an explanatory view of a configuration of an example of fitting member information used in the component mounting system of the exemplary embodiment;

FIG. 12 is an explanatory view of a configuration of an example of the fitting member information used in the component mounting system of the exemplary embodiment;

FIG. 13 is an explanatory view of a configuration of an example of the fitting member information used in the component mounting system of the exemplary embodiment;

FIG. 14A is an explanatory view of a configuration of an example of use member information used in the component mounting system of the exemplary embodiment;

FIG. 14B is an explanatory view of a configuration of an example of the use member information used in the component mounting system of the exemplary embodiment;

FIG. 14C is an explanatory view of a configuration of an example of the use member information used in the component mounting system of the exemplary embodiment;

FIG. 15 is an explanatory view of a configuration of an example of preparation instructing information used in the component mounting system of the exemplary embodiment;

FIG. 16A is an explanatory view of a configuration of an example of under ranked member information used in the component mounting system of the exemplary embodiment;

FIG. 16B is an explanatory view of a configuration of an example of the under ranked member information used in the component mounting system of the exemplary embodiment;

FIG. 16C is an explanatory view of a configuration of an example of the under ranked member information used in the component mounting system of the exemplary embodiment;

FIG. 17 is an explanatory view of a configuration of an example of processing instruction information used in the component mounting system of the exemplary embodiment.

DETAILED DESCRIPTION

Figure 1:
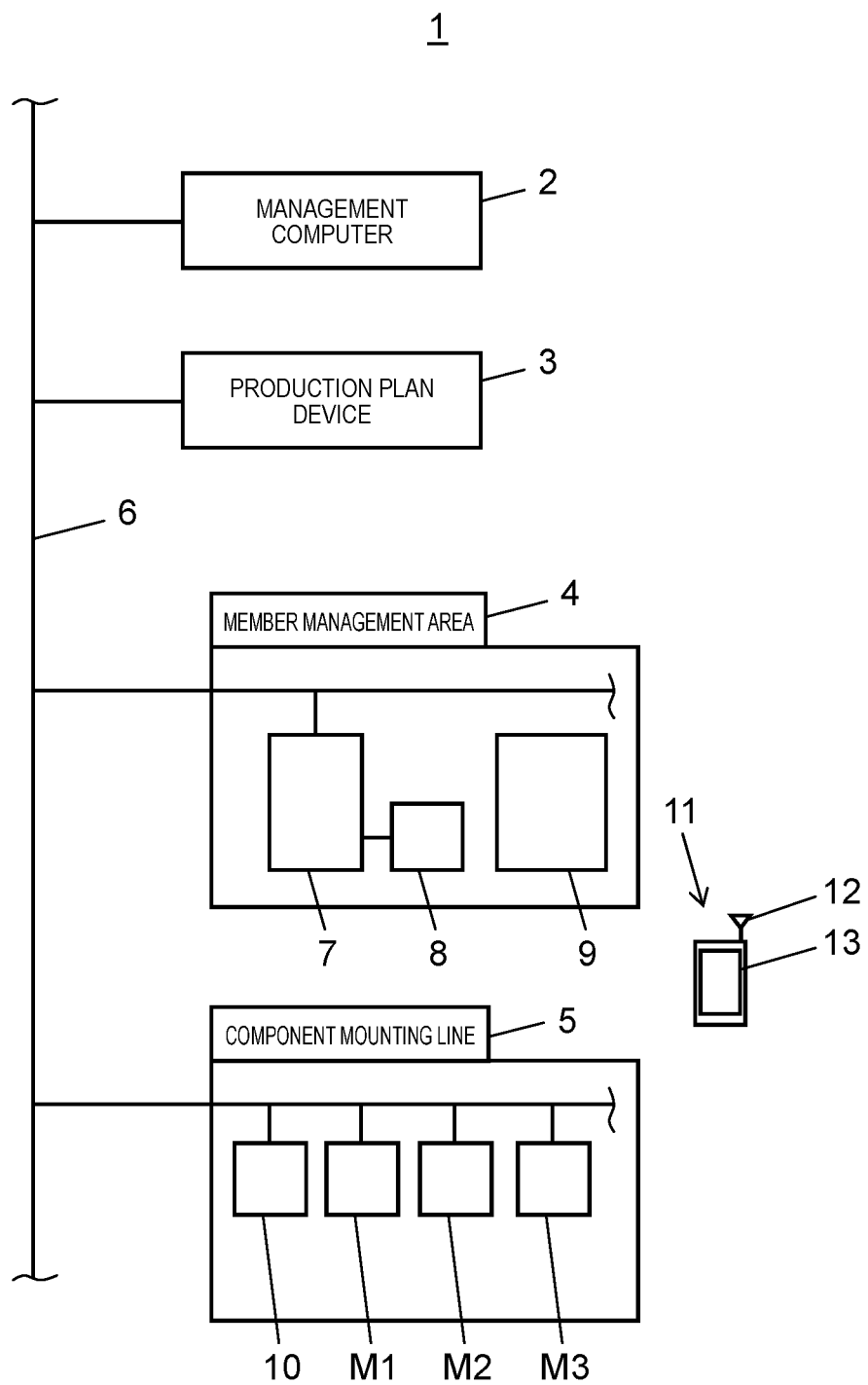
FIG. 1 is an explanatory view of a configuration of a component mounting system of an exemplary embodiment.

The related art including PTL 1 and PTL 2 does not consider mounting accuracy of a member which fluctuates due to a use situation or the like when the member used for the production of the mounting board is prepared. Therefore, further improvement is demanded.

In addition, in the related art including PTL 1, when the rank of the member is lowered, the frequency of maintenance becomes high and the member cannot be used for the production during the maintenance. Therefore, use efficiency of the member is lowered.

Hereinafter, an exemplary embodiment will be described in detail with reference to the drawings. A configuration, a shape, or the like described below is an example for explanation and can be appropriately changed in accordance with the specifications of a component mounting system and a management computer (member preparation apparatus and member processing device). Hereinafter, the same reference numerals are given to corresponding elements in all the drawings and redundant explanation will be omitted.

First, a configuration of component mounting system 1 will be described with reference to FIG. 1. Component mounting system 1 has a function of mounting a component on a board to produce a mounting board and a function of managing and maintaining a member used for the production of the mounting board. Component mounting system 1 is mainly configured of management computer 2, production plan device 3, member management area 4, and component mounting line 5, which are connected by communication network 6. Management computer 2 performs production management of the mounting board, management of the member used for the production of the mounting board, management of maintenance of the member, or the like. Production plan device 3 collects, arranges, and stores board information of the mounting board produced in component mounting system 1, component information, production plan of the mounting board, or the like.

Member management device 7, maintenance work device 8, and member storage 9 are provided in member management area 4. Member management device 7 is connected to communication network 6. Maintenance work device 8 is connected to member management device 7. Member storage 9 stores a member that is not currently used for the production of the mounting board, a member that is waiting for maintenance work, or the like. Member management device 7 manages a location of a retained member which is retained by component mounting system 1 such as a member used for the production of the mounting board in component mounting system 1 and the member stored in member storage 9, a member rank determined by a state and quality of a member, or the like. Maintenance work device 8 executes the maintenance work of a member such as a suction nozzle, a tape feeder, or a mounting head. Maintenance work device 8 may be connected to member management device 7 via communication network 6.

In FIG. 1, component mounting line 5 includes line management device 10, printer M1, and mounting machines M2 and M3, which are connected to management computer 2 via communication network 6. Printer M1 executes solder printing work for printing cream solder on a board carried in from an upstream side by a printing work unit via a mask. Mounting machines M2 and M3 execute component mounting work for mounting a component on a board in which the cream solder is printed by printer M1 by a component mounting work unit to produce the mounting board. Line management device 10 collects information such as a use situation of the member used in printer M1, mounting machines M2 and M3, an error rate, or the like in addition to managing work between respective devices of component mounting line 5.

Component mounting line 5 further includes an inspection machine that inspects a printing state and a component mounting state before and after printer M1 and mounting machines M2 and M3, and line management device 10 may collect the error rate based on an inspection result of the inspection machine. In addition, it is not necessary for component mounting line 5 to have two mounting machines M2 and M3, and it may be one or three or more. In addition, it is not necessary for component mounting system 1 to have one component mounting line 5 and component mounting system 1 may have a plurality of component mounting lines 5. In a case where component mounting system 1 includes the plurality of component mounting lines 5, line management device 10 may be disposed for each component mounting line 5 and one line management device 10 common to the plurality of component mounting lines 5 may be disposed. That is, information collected by line management device 10 may be stored in association with information specifying each device of component mounting line 5.

In FIG. 1, a worker performing work in member management area 4, component mounting line 5, or the like carries portable terminal 11. Portable terminal 11 includes terminal-side communicator 12 that wirelessly communicates with management computer 2 to transmit and receive information, and touch panel 13 that has a display function and an input function. Portable terminal 11 display-processes information received from management computer 2 to display the information on touch panel 13. In addition, portable terminal 11 transmits the information input from touch panel 13 or the like to management computer 2.

Configurations of mounting machines M2 and M3 which mount the component on the board will be described with reference to FIG. 2. Board transport mechanism 15 that transports board B input from printer M1 on the upstream side is disposed at an upper portion of base 14 in an X direction (board transport direction). Component supply unit 16 is disposed on a side of board transport mechanism 15 in a Y direction (direction orthogonal to the X direction in a horizontal plane). A plurality of detachable tape feeders 17 are disposed in component supply unit 16 in parallel in the X direction. Tape feeder 17 pitch-feeds carrier tape T storing component D in a tape feeding direction so that component D is supplied to a component pick-up position by the mounting head which is described later. Carrier tape T is held by component supply unit 16 in a state of being wound and stored around and in reel R.

Mounting head 18 and head moving mechanism 19 that moves mounting head 18 which is installed in the horizontal direction (X direction and Y direction) are disposed above base 14. Mounting head 18 has a plurality of suction heads 18a. Suction nozzle 18b, which sucks and holds component D, is detachably installed on a lower end of each of suction heads 18a. Suction head 18a raises and lowers suction nozzle 18b in a Z direction (direction orthogonal to the horizontal plane). Mounting head 18 picks up component D supplied to the component pick-up position of tape feeder 17 by suction nozzle 18b and mounts component D at the mounting position of board B positioned in board transport mechanism 15.

Figure 2:
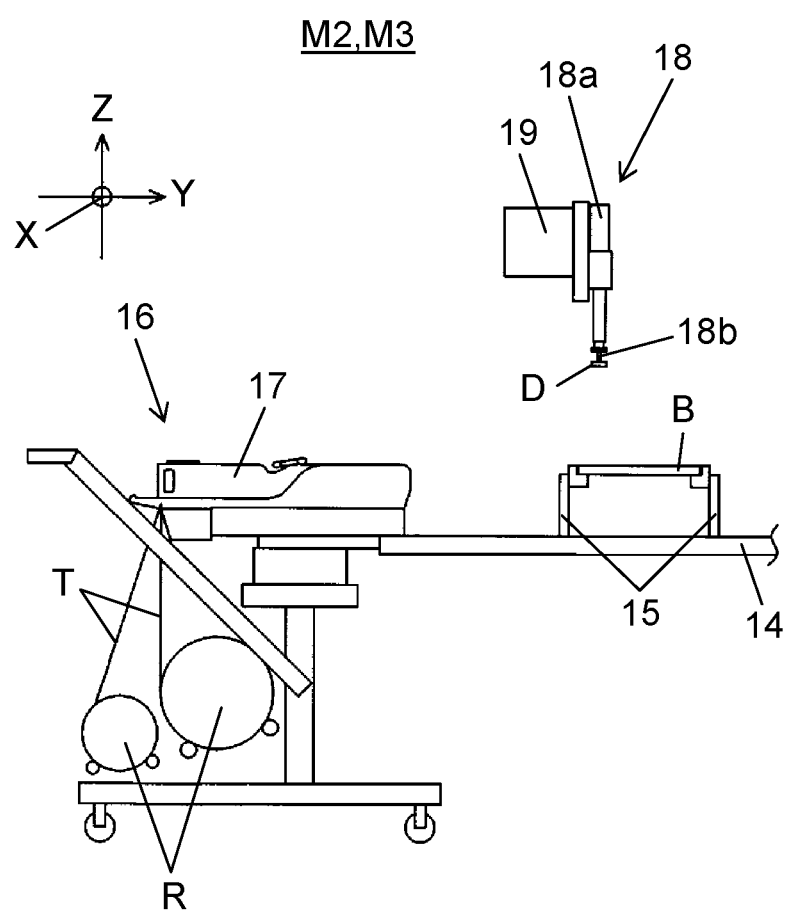
FIG. 2 is an explanatory view of a configuration of a mounting machine included in the component mounting system of the exemplary embodiment.

In FIG. 2, members such as suction nozzle 18b, mounting head 18, and tape feeder 17 (component supplier) are appropriately selected in accordance with a type of component D mounted on board B, an interval between adjacent components D, mounting accuracy, or the like, and are installed in mounting machines M2 and M3 to be used.

If a problem occurs when mounting of component D on board B is repeatedly executed in mounting machines M2 and M3, an error such as a supply error, a suction error, or a mounting error occurs. The supply error occurs in a case where tape feeder 17 cannot normally supply component D to the component pick-up position. The suction error occurs in a case where suction nozzle 18b cannot normally suck component D. The mounting error occurs in a case where component D is not normally mounted on the mounting position of board B. As described above, various errors occurred during mounting work are appropriately collected by line information collection unit 31a (see FIG. 3) included in line management device 10 and are stored as line situation information I1a (see FIG. 3).

Next, a configuration of a control system of component mounting system 1 will be described with reference to FIG. 3. Production plan device 3 includes a production controller 21, production storage 22, and communicator 23. Communicator 23 is a communication interface and transmits and receives a signal and information to and from management computer 2 via communication network 6. Production controller 21 is a calculation device having a CPU function, collects and arranges various pieces of information from a database (not illustrated) connected to communication network 6, and stores the various pieces of information in production storage 22. Production storage 22 is a storage device and stores board information Iba, component information Ida, production plan information Ipa, and the like.

Board information Iba includes a type and a mounting position of component D mounted on board B.

Component information Ida includes at least one of the type, a shape, and a size of component D mounted on the mounting board. Production plan information Ipa includes a production plan such as the number of production and a production period of the mounting board.

Here, an example of component information Ida (Idb) will be described with reference to FIG. 5. In the example, component information Ida includes the type of component D in "component name" column 71, the shape of component D in "shape" column 72, and the size of component D in "size" column 73. "Normal" which is a substantially cubic shape, "special" which is a shape in which an electrode terminal extends outward from a main portion of the substantial cube, or the like is stored in the shape of component D.

A member rank required for the member used when component D of the type of "component name" column 71 on board B is designated in "request member rank" columns 74a to 76c. More specifically, the request member rank of suction nozzle 18b that sucks component D is designated to Yes (usable) or No (unusable) in "Excellent" column 74a, "Good" column 74b, and "Bad" column 74c. The request member rank of tape feeder 17 that supplies component D is designated to Yes (usable) or No (unusable) in "Excellent" column 75a, "Good" column 75b, and "Bad" column 75c. Furthermore, the request member rank of mounting head 18 that mounts component D on board B is designated to Yes (usable) or No (unusable) in "Excellent" column 76a, "Good" column 76b, and "Bad" column 76c.

Figure 3:
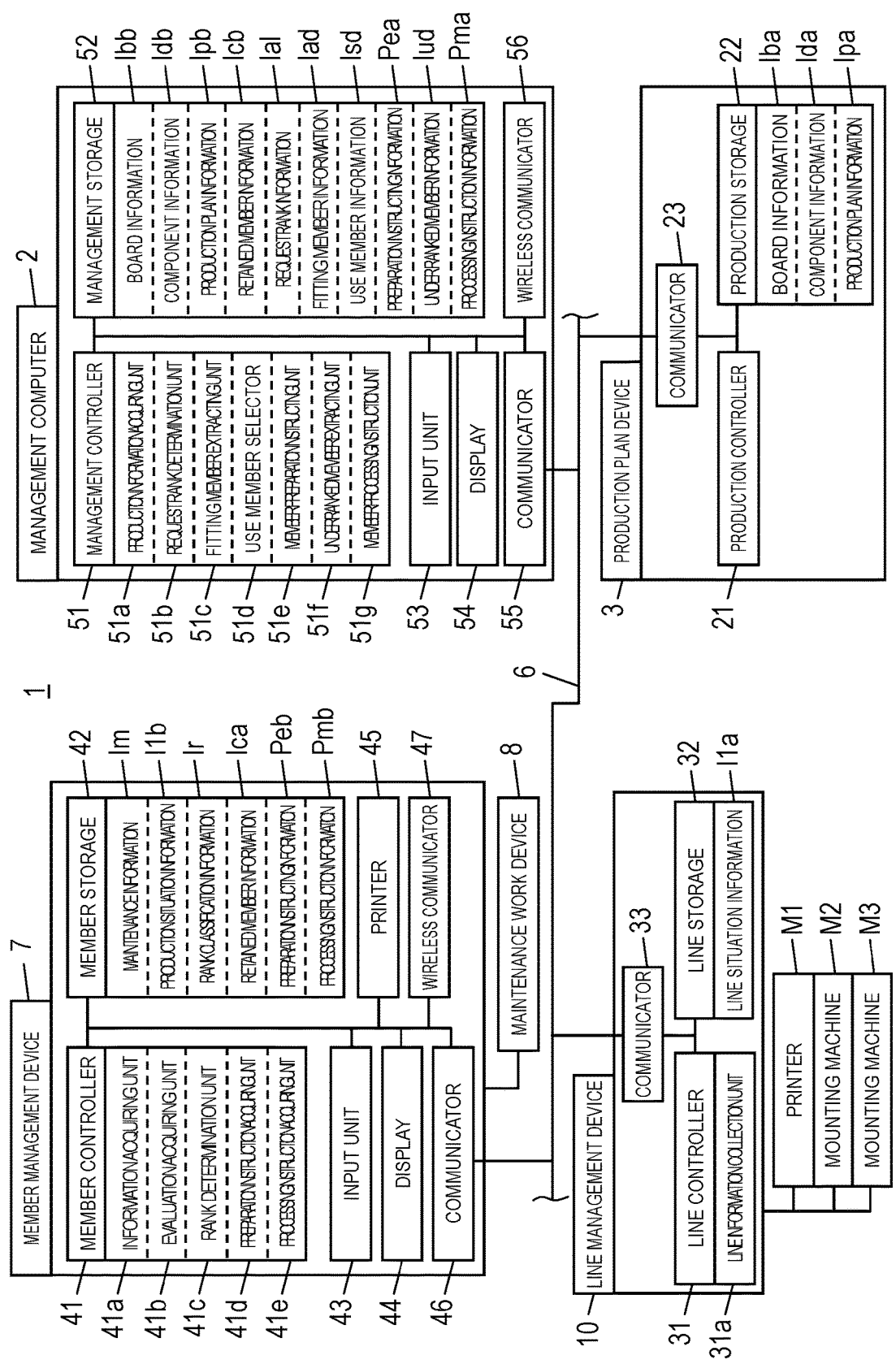
FIG. 3 is a block diagram illustrating a configuration of a control system of the component mounting system of the exemplary embodiment.

In FIG. 3, line management device 10 includes line controller 31, line storage 32, and communicator 33. Communicator 33 is a communication interface. Communicator 33 transmits and receives of a signal and information between management computer 2 and member management device 7 via communication network 6. Line controller 31 is a calculation device having a CPU function and includes an internal processor such as line information collection unit 31a. Line storage 32 is a storage device and stores line situation information I1a or the like. Line information collection unit 31a collects the number of mounting of the component of member (suction nozzle 18b, tape feeder 17, mounting head 18, or the like) used for the production of the mounting board installed in printer M1, mounting machines M2 and M3, a use period, the number of various errors (section error, supply error, mounting error, and the like), and the like to store them in line storage 32 as line situation information I1a.

In FIG. 3, member management device 7 includes member controller 41, member storage 42, input unit 43, display 44, printer 45, communicator 46, and wireless communicator 47. Input unit 43 is an input device such as a keyboard, a touch panel, a mouse, or the like, and is used when an operation command or data is input. Display 44 is a display device such as a liquid crystal panel and displays various pieces of information in addition to various screens such as an operation screen for operation by input unit 43. Printer 45 prints a preparation instruction, a processing instruction, or the like acquired by management computer 2. Communicator 46 is a communication interface and transmits and receives a signal and information between management computer 2 and line management device 10 via communication network 6. Wireless communicator 47 wirelessly communicates with portable terminal 11 to transmit and receive information.

Member controller 41 is a calculation device having a CPU function and includes internal processors such as information acquiring unit 41a, evaluation acquiring unit 41b, rank determination unit 41c, preparation instruction acquiring unit 41d, and processing instruction acquiring unit 41e. Member storage 42 is a storage device and stores maintenance information Im, production situation information I1b, rank classification information Ir, retained member information Ica, preparation instructing information Peb, processing instruction information Pmb, and the like. Maintenance information Im stores the number of times of maintenance, an elapsed time after the last maintenance, or the like which is information of the maintenance work executed by maintenance work device 8 connected to member management device 7 in association with each member.

In FIG. 3, information acquiring unit 41a acquires line situation information I1a from line management device 10 to store line situation information I1a in member storage 42 as production situation information I1b. Rank classification information Ir includes a state of a member and rank classification of quality for determining the member rank of each member. Here, an example of rank classification information Ir will be described with reference to FIGS. 6A and 6B. The member rank is determined based on the member state rank and the member quality rank. FIG. 6A illustrates rank classification information Ir1 of the member state rank and FIG. 6B illustrates rank classification information Ir2 of the member quality rank.

In FIG. 6A, the member state rank is determined based on item (a) cumulative use time, item (b) the number of times of maintenance, item (c) elapsed time after the last maintenance indicated in "item" column 81. The cumulative use time is calculated based on production situation information I1b. The number of times of maintenance and the elapsed time after the last maintenance are included in maintenance information Im. In "number of items" column 82, contents for determining the member state rank indicated in "member state rank" column 83 is indicated. In the example, the member state rank is "Excellent" in a case where "all items are within a threshold", "Good" in a case where "one item is out of the threshold", "Bad" in a case where "two items are out of the threshold", and "Disabled" in a case where "all items are out of the threshold" of items (a) to (c).

In FIG. 6B, the member quality rank is determined based on item (d) error rate per the number of times of component mounting, item (e) error rate per the use period, and item (f) evaluation information of a member indicated in "item" column 84. The error rate per the number of times of component mounting and the error rate per the use period are calculated based on production situation information I1b. The evaluation information of the member is input by a worker based on information such as a process capability index obtained by accuracy verification of a facility, a subjective judgment of the worker with respect to a degradation state of the facility. Contents for determining the member quality rank indicated in "member quality rank" column 86 is indicated in "number of items" column 85.

In the example, the member quality rank is "Excellent" in a case where "all items are within a threshold", "Good" in a case where "one item is out of the threshold", "Bad" in a case where "two items are out of the threshold", and "Disabled" in a case where "all items are out of the threshold" of items (d) to (f). In FIGS. 6A and 6B, the threshold of items (a) to (f) is determined based on an achievement and an experience. In addition, an item for determining the member state rank and the member quality rank is not limited to the example described above is appropriately determined in accordance with the type of the member, mounting quality to be required, or the like.

In FIG. 3, evaluation acquiring unit 41b acquires the evaluation information of the member for determining the member quality rank. More specifically, the evaluation information of the member input into touch panel 13 of portable terminal 11 by the worker is acquired by acquiring unit 41b via wireless communicator 47 to store the evaluation information of the member to retained member information Ica based on an external appearance of the member and a frequency of an error in the production of the mounting board, or the like.

Rank determination unit 41c determines the member rank of a plurality of the retained members usable in the production of the mounting board based on maintenance information Im, production situation information I1b, and rank classification information Ir, and creates retained member information Ica in which the determined member rank in is associated with each retained member to store retained member information Ica in member storage 42. That is, the member rank is determined based on the member state rank (see FIG. 6A) and the member quality rank (see FIG. 6B). The member state rank is set based on at least one of the cumulative use time of the member, the number of times of maintenance, and the elapsed time after the last maintenance. The member quality rank is set based on at least one of the error rate per the number of times of component mounting of the member, the error rate per the use period of the member, and the evaluation information of the member.

Here, retained member information Ica (Icb) will be described with reference to FIGS. 7 to 9. FIG. 7 illustrates an example of retained member information Ica1 (Icb1) of suction nozzle 18b. Retained member information Ica1 (Icb1) of suction nozzle 18b includes the number of the member in "number of nozzle" column 91, the type of the member in "nozzle type" column 92, the shape of component D capable of being sucked in "corresponding component shape" column 93, the size of component D capable of being sucked in "corresponding component size" column 94, a minimum interval between adjacent components capable of being mounted on board B in "corresponding mounting interval" column 95, a current member state rank in "member state rank" column 96, a current member quality rank in "member quality rank" column 97, and a current member rank in "member rank" column 98.

FIG. 8 illustrates an example of retained member information Ica2 (Icb2) of tape feeder 17. Retained member information Ica2 (Icb2) of tape feeder 17 includes the number of the member in "number of feeder" column 101, the type of the member in "type of feeder" column 102, the size of carrier tape T capable of being installed in "corresponding tape size" column 103, the current member state rank in "member state rank" column 104, the current member quality rank in "member quality rank" column 105, and the current member rank in "member rank" column 106.

FIG. 9 illustrates an example of retained member information Ica3 (Icb3) of mounting head 18. Retained member information Ica3 (Icb3) of mounting head 18 includes the number of the member (number of head" column 111, the type of the member in "type of head" column 112, the number of suction nozzles 18b capable of being installed in mounting head 18 in "number of nozzles" column 113, the size of component D capable of being mounted in "corresponding component size" column 114, the current member state rank in "member state rank" column 115, the current member quality rank in "member quality rank" column 116, and the current member rank in "member rank" column 117. In the examples, rank determination unit 41c determines a worse one of the member state rank and the member quality rank as the member rank.

In FIG. 3, preparation instruction acquiring unit 41d acquires preparation instructing information Pea for preparing the use member used for the production of the mounting board which is described later from management computer 2 to store preparation instructing information Pea to member storage 42 as preparation instructing information Peb. Processing instruction acquiring unit 41e acquires processing instruction information Pma including a processing instruction for maintaining a under ranked member in which the request member rank which is described later is not satisfied from management computer 2 to store processing instruction information Pma as processing instruction information Pmb in member storage 42.

In FIG. 3, management computer 2 includes management controller 51, management storage 52, input unit 53, display 54, communicator 55, and wireless communicator 56. Input unit 53 is an input device such as a keyboard, a touch panel, or a mouse, and is used when an operation command and data is input. Display 54 is a display device such as a liquid crystal panel and displays various pieces of information in addition to various screens such as an operation screen for operation by input unit 53. Communicator 55 is a communication interface and transmits and receives a signal and information between production plan device 3, member management device 7, and line management device 10 via communication network 6. Wireless communicator 56 wirelessly communicates with portable terminal 11 to transmit and receive information.

Management controller 51 is a calculation device having a CPU function and includes production information acquiring unit 51a, request rank determination unit 51b, fitting member extracting unit 51c, use member selector 51d, member preparation instructing unit 51e, under ranked member extracting unit 51f, member processing instruction unit 51g, and the like. Management storage 52 is a storage device and stores board information Ibb, component information Idb, production plan information Ipb, retained member information Icb, request rank information Ial, fitting member information Iad, use member information Isd, preparation instructing information Pea, under ranked member information Iud, the processing instruction information Pma, and the like.

In FIG. 3, production information acquiring unit 51a acquires board information Iba, component information Ida, and production plan information Ipa including the production plan of the mounting board from production plan device 3, and retained member information Ica from member management device 7 to store them in management storage 52 as board information Ibb, component information Idb, production plan information Ipb, and retained member information Icb respectively.

Request rank determination unit 51b determines the request member rank of the member fitted to the production of the mounting board based on board information Ibb and component information Idb (see FIG. 5) acquired by production information acquiring unit 51a to store the request member rank in management storage 52 as request rank information Ial. In this case, request rank determination unit 51b determines the request rank based on an interval (mounting interval) between component D mounted on board B and component D adjacent to component D.

Request rank determination unit 51b calculates the mounting interval based on the mounting position of component D in the mounting board included in board information Ibb, and the shape and the size of component D included in component information Idb. Therefore, a member which can realize required mounting quality can be appropriately prepared.

Here, an example of request rank information Ial will be described with reference to FIG. 10. Request rank information Ial includes the type of component D mounted on the mounting board in "component name" column 121, the shape of component D in "shape" column 122, the size of component D in "size" column 123, the minimum interval between adjacent components D in "minimum mounting interval" column 124, the number of component D mounted on the mounting board in "number of component" column 125, the request member rank of suction nozzle 18b that sucks component D in "suction nozzle" column 126, the request member rank of tape feeder 17 that supplies component D in "tape feeder" column 127, and the request member rank of mounting head 18 that mounts component D in "mounting head" column 128. Here, the request rank of four types of components D (PA01, PA02, PA03, and PA08) is provided.

In FIG. 3, fitting member extracting unit 51c extracts the fitting member fitted to the request member rank (request rank information Ial (see FIG. 10)) determined by request rank determination unit 51b in the plurality of the retained members based on production plan information Ipb and retained member information Icb (see FIGS. 7 to 9) acquired by production information acquiring unit 51a to store the fitting member in management storage 52 as fitting member information Iad.

Here, fitting member information Iad will be described with reference to FIGS. 11 to 13. FIG. 11 illustrates an example of fitting member information Iad1 of suction nozzle 18b. Fitting member information Iad1 of suction nozzle 18b includes the type of component D mounted on the mounting board in "component name" column 131, the number of the member in "number of nozzle" column 132, the type of the member in "type of nozzle" column 133, the request member rank of suction nozzle 18b that sucks component D in "request member rank" column 134, and the current member rank of suction nozzle 18b in "member rank" column 135. Here, NA01 and NA02, NA01, NA02, and NB01, and a plurality of the fitting members are extracted as suction nozzle 18b that sucks component D (PA01) and component D (PA02).

FIG. 12 illustrates an example of fitting member information Iad2 of tape feeder 17. Fitting member information Iad2 of tape feeder 17 includes the type of component D that is mounted on the mounting board in "component name" column 141, the number of the member in "number of feeder" column 142, the type of the member in "type of feeder" column 143, the request member rank of tape feeder 17 that supplies component D in "request member rank" column 144, and the current member rank of tape feeder 17 in "member rank" column 145. Here, as tape feeder 17 that supplies components D (PA01 to PA03, and PA08), the plurality of the fitting members (FA01 to FA04) are extracted.

FIG. 13 illustrates an example of fitting member information Iad3 of mounting head 18. Fitting member information Iad3 of mounting head 18 includes the type of component D that is mounted on the mounting board in "component name" column 151, the number of the member in "number of head" column 152, the type of the member in "type of head" column 153, the request member rank of mounting head 18 that mounts component D in "request member rank" column 154, and the current member rank of mounting head 18 in "member rank" column 155. Here, as mounting head 18 that mounts component D (PA08), HA01 and HB01, and the plurality (two) of the fitting members are extracted.

For the member rank of the fitting member extracted by fitting member extracting unit 51c of the examples, an expected member rank, which is expected when the member is prepared (dispensed from member storage 9) for use in the production of the mounting board, is used. More specifically, in a case where the member is scheduled to be maintained until the member is used for the production of a target mounting board, the expected member rank uses the member rank that is expected after the maintenance.

In addition, in a case where the member is also used for other production before being used for the production of the target mounting board, the expected member rank is used based on a cumulative use time or the like after the expected member rank is used after being used for the production. Therefore, also in a case where there is a time before the production of the target mounting board is started, the member used for the production of the mounting board is appropriately prepared based on a more accurate member rank.

In FIG. 3, use member selector 51d selects the use member that is used for the production of the mounting board in the fitting member (see FIGS. 11 to 13) extracted by fitting member extracting unit 51c to store the use member in management storage 52 as use member information Isd.

Here, use member information Isd will be described with reference to FIGS. 14A, 14B, and 14C. FIG. 14A illustrates an example of use member information Isd1 of suction nozzle 18b. Use member information Isd1 of suction nozzle 18b includes the number of the member in "number of nozzle" column 161, the type of the member in "type of nozzle" column 162, the request member rank in "request member rank" column 163, and the current member rank in "member rank" column 164.

FIG. 14B illustrates an example of use member information Isd2 of tape feeder 17. Use member information Isd2 of tape feeder 17 includes the number of the member in "number of feeder" column 165, the type of the member in "type of feeder" column 166, the request member rank in "request member rank" column 167, and the current member rank in "member rank" column 168. FIG. 14C illustrates an example of use member information Isd3 of mounting head 18. Use member information Isd3 of mounting head 18 includes the number of the member in "number of head" column 169, the type of the member in "type of head" column 170, the request member rank in "request member rank" column 171, and the current member rank in "member rank" column 172.

In FIG. 3, member preparation instructing unit 51e generates an instruction to prepare the use member selected by use member selector 51d to store the instruction in management storage 52 as preparation instructing information Pea.

Here, an example of preparation instructing information Pea (Peb and Pec) will be described with reference to FIG. 15. Preparation instructing information Pea includes the number of the member of the members such as suction nozzle 18b, tape feeder 17, and mounting head 18 to be prepared in "number of member" column 181, the type of the member in "type of member" column 182, and the request member rank of the member to be prepared in "request member rank" column 183.

In FIG. 3, in a case where fitting member extracting unit 51c cannot extract the number of the fitting members necessary for the production of the mounting board, under ranked member extracting unit 51f extracts the under ranked member that does not satisfy the request member rank in the plurality of the retained members to store the under ranked member in management storage 52 as under ranked member information Iud.

Here, under ranked member information Iud will be described with reference to FIGS. 16A, 16B, and 16C. FIG. 16A illustrates an example of under ranked member information Iud1 of suction nozzle 18b. Under ranked member information Iud1 of suction nozzle 18b includes the number of the member in "number of member" column 191, the type of the member in "type of nozzle" column 192, the request member rank in "request member rank" column 193, and the current member rank in "member rank" column 194. Here, two suction nozzles 18b of which the number of the nozzle is NA02 and ND01 are extracted as the under ranked member in use member information Isd1 (see FIG. 14A) of suction nozzle 18b.

FIG. 16B illustrates an example of under ranked member information Iud2 of tape feeder 17. Under ranked member information Iud2 of tape feeder 17 includes the number of the member in "number of feeder" column 195, the type of the member in "type of feeder" column 196, the request member rank in "request member rank" column 197, and the current member rank in "member rank" column 198. Here, tape feeder 17 of which the number of the feeder is FA02 is extracted as the under ranked member in use member information Isd2 (see FIG. 14B) of tape feeder 17.

FIG. 16C illustrates an example of under ranked member information Iud3 of mounting head 18. Under ranked member information Iud3 of mounting head 18 includes the number of the member in "number of head" column 199, the type of the member in "type of head" column 200, the request member rank in "request member rank" column 201, and the current member rank in "member rank" column 202. Here, since mounting head 18 of which the current member rank does not satisfy the request member rank is not present in use member information Isd3 (see FIG. 14C) of mounting head 18, the under ranked member is not extracted.

In FIG. 3, member processing instruction unit 51g generates an instruction to perform processing such as maintenance for satisfying the request member rank by the current member rank of the under ranked member extracted by under ranked member extracting unit 51f to store the instruction in management storage 52 as processing instruction information Pma. In addition, in a case where member processing instruction unit 51g determines that the processing of the under ranked member is not completed by the date and time required for the member to produce the mounting board based on the time required for preparing the under ranked member or the like, member processing instruction unit 51g notifies the fact of display 54 of management computer 2. Moreover, the fact may be transmitted to portable terminal 11 or member management device 7 so as to notify the fact to touch panel 13 of portable terminal 11 or display 44 of member management device 7.

Here, an example of processing instruction information Pma (Pmb and Pmc) will be described with reference to FIG. 17. Processing instruction information Pma includes the number of the member of the members such as suction nozzle 18b, tape feeder 17, and mounting head 18 to be processed in "number of member" column 211, the type of the member in "type of member" column 212, the request member rank that is expected after being processed in "request member rank" column 213, the current member rank in "member rank" column 214, and the date and time when the processing is expected to be completed in "scheduled completion date and time" column 215.

Figure 4:
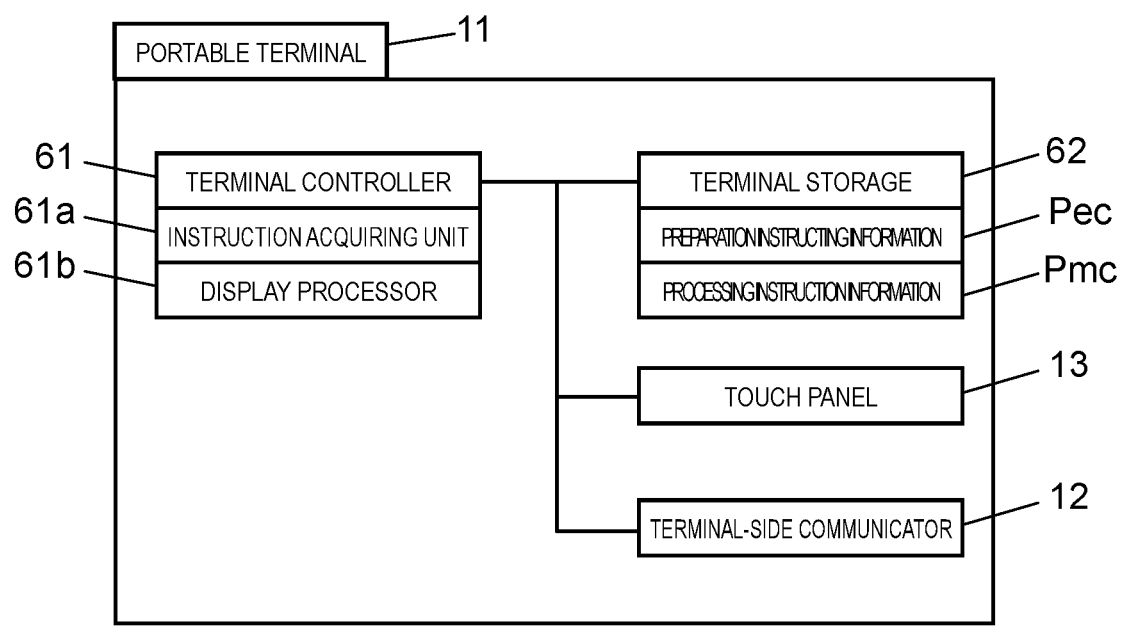
FIG. 4 is a block diagram illustrating a configuration of a control system of a portable terminal used in the component mounting system of the exemplary embodiment.

Next, a configuration of a control system of portable terminal 11 will be described with reference to FIG. 4. Portable terminal 11 includes terminal controller 61, terminal storage 62, terminal-side communicator 12, and touch panel 13. Terminal-side communicator 12 transmits and receives information between management computer 2 and member management device 7 by wireless communication. Terminal controller 61 is a calculation device having a CPU function and includes the internal processor such as instruction acquiring unit 61*a* and display processor 61*b*. Terminal storage 62 is a storage device and stores preparation instructing information Pec, processing instruction information Pmc, and the like. Instruction acquiring unit 61*a* acquires preparation instructing information Pea (see FIG. 15) and processing instruction information Pma (see FIG. 17) from management computer 2 to store them in terminal storage 62 as preparation instructing information Pec and processing instruction information Pmc.

Display processor 61*b* creates an operation screen for preparing (dispensing) the member used for the production of the mounting board by the worker based on preparation instructing information Pec to display the operation screen on touch panel 13. In addition, display processor 61*b* creates an operation screen for cleaning a member, adjusting a member, and for updating the evaluation information of a member for which the member rank of the under ranked member satisfies the request member rank by the worker to display the operation screen on touch panel 13 based on processing instruction information Pmc. That is, processing for satisfying the request member rank instructed by member processing instruction unit 51*g* is at least one of cleaning of the member, the adjustment of the member, and updating of the evaluation information of the member. It is possible to restore the state of the member and to maintain the quality and the error rate of component mounting at an appropriate level by cleaning and the adjustment (maintenance) of the member.

As described above, management computer 2 includes production information acquiring unit 51*a* that acquires board information Iba (Ibb), component information Ida (Idb), production plan information Ipa (Ipb), and retained member information Ica (Icb), and request rank determination unit 51*b* that determines the request member rank of the members (suction nozzle 18*b*, tape feeder 17, and mounting head 18) fitted to the production of the mounting board. Furthermore, management computer 2 is a member preparation apparatus including fitting member extracting unit 51*c* that extracts the fitting member that is fitted to the request member rank, use member selector 51*d* that selects the use member used for the production of the mounting board, and member preparation instructing unit 51*e* that generates an instruction to prepare the use member. It is possible to appropriately prepare the member used for the production of the mounting board by a member preparation apparatus based on the required member rank.

In addition, management computer 2 is a member processing device including production information acquiring unit 51*a*, request rank determination unit 51*b*, fitting member extracting unit 51*c*, under ranked member extracting unit 51*f*, and member processing instruction unit 51*g*.

Production information acquiring unit 51*a* acquires board information Iba (Ibb), component information Ida (Idb), production plan information Ipa (Ipb), and retained member information Ica (Icb).

Request rank determination unit 51*b* determines the request member rank of the member fitted to the production of the mounting board.

Fitting member extracting unit 51*c* extracts the fitting member that is fitted to the request member rank.

In a case where the required number of the fitting members cannot be extracted, under ranked member extracting unit 51*f* extracts the under ranked member which does not satisfy the request member rank in the plurality of the retained members.

Member processing instruction unit 51*g* generates an instruction to perform processing for satisfying the request member rank by the member rank of the under ranked member. Processing such as maintenance can be performed at an appropriate timing by using the member for the production of the mounting board by the member processing device.

Next, a member management method in component mounting system 1 will be described along a flow of FIG. 18. First, in management computer 2, production information acquiring unit 51*a* acquires board information Ibb, component information Idb, production plan information Ipb, and retained member information Icb (ST1: a production information acquiring step). Next, request rank determination unit 51*b* determines the request member rank (request rank information Ial (see FIG. 10)) of the members (suction nozzle 18*b*, tape feeder 17, and mounting head 18) that are fitted to the production of the mounting board based on board information Ibb including the mounting position of component D mounted on the mounting board and component information Idb (see FIG. 5) of the component mounted on the mounting board (ST2: a request rank determining step).

Next, fitting member extracting unit 51*c* extracts the fitting member (fitting member information Iad (see FIGS. 11 to 13)) that is fitted to the request member rank determined in the request rank determining step (ST2) in the plurality of the retained members based on the production plan (production plan information Ipb) of the mounting board and retained member information Icb (see FIGS. 7 to 9) in which the member rank is associated with each of the plurality of the retained members usable for the production of the mounting board (ST3: a fitting member extracting step). Moreover, the member rank of the fitting member extracted in the fitting member extracting step (ST3) is not limited to the current member rank may be the expected member rank that is expected when the member is prepared. Therefore, the member can be appropriately prepared and maintained (processed).

Figure 18:
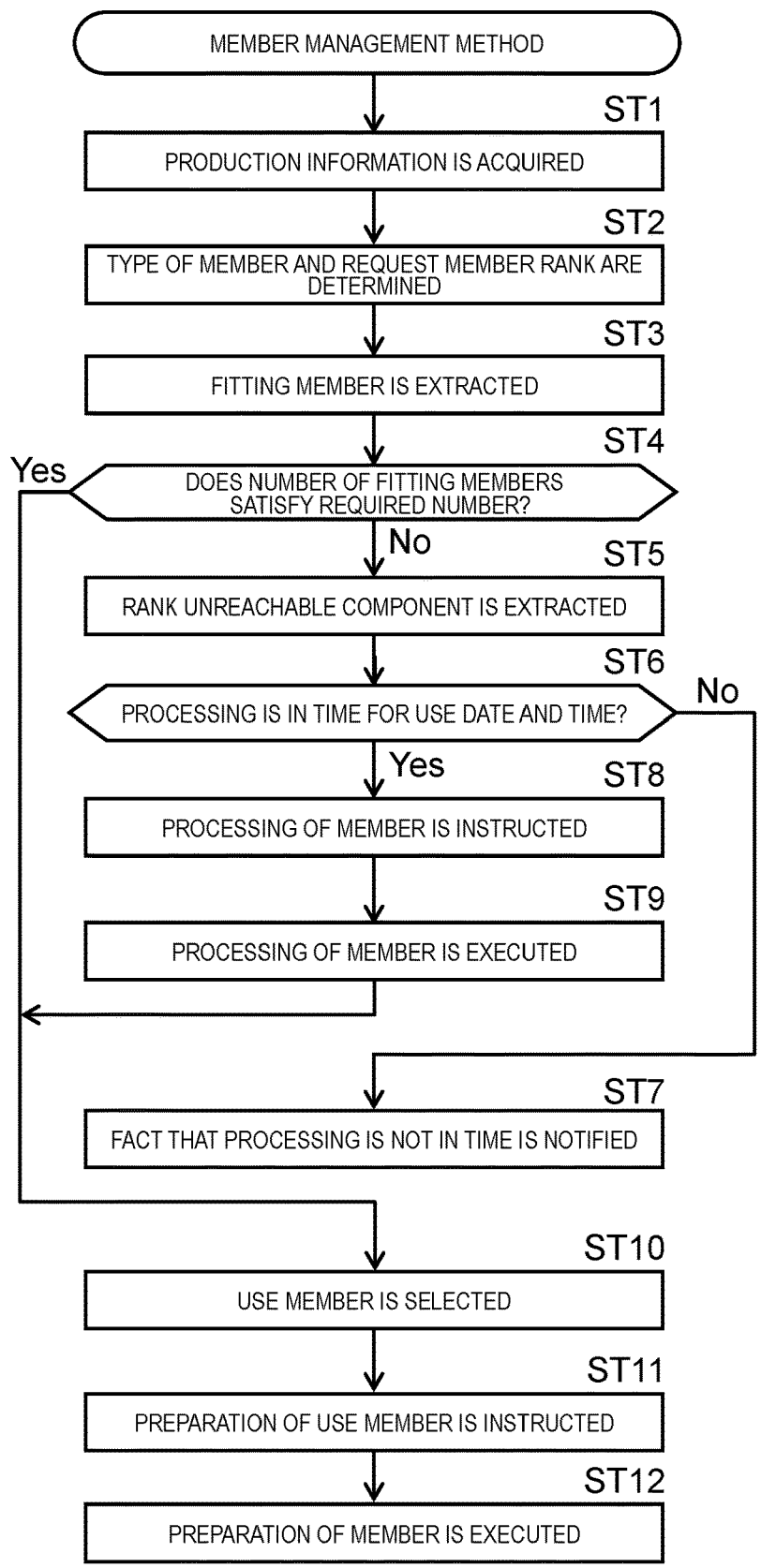
FIG. 18 is a flowchart illustrating a member management method in the component mounting system of the exemplary embodiment.

In FIG. 18, next, under ranked member extracting unit 51*f* determines whether or not the required number of the fitting members in the production of the mounting board can be extracted in the fitting member extracting step (ST3) ((ST4: the number of the fitting members determining step). In a case where the required number of the fitting members for the production of the mounting board cannot be extracted (No in ST4), under ranked member extracting unit 51*f* extracts the under ranked member (under ranked member information Iud (see FIGS. 16A, 16B, and 16C)) which does not satisfy the request member rank in the plurality of the retained members (ST5: a under ranked member extracting step). Next, under ranked member extracting unit 51*f* determines whether or not processing such as maintenance of the under ranked member is in time for the use date and time of the member (ST6: delivery date determination processing).

In a case where processing is not in time for the use date and time (No in ST6), the fact that processing is not in time for the use date and time is notified to display 54 of management computer 2, touch panel 13 of portable terminal 11, or display 44 of member management device 7 (ST7: a notifying step). In a case where processing is in time for the use date and time (Yes in ST6), member processing instruction unit 51g generates an instruction (processing instruction information Pma (see FIG. 17)) to perform processing for satisfying the request member rank by the member rank of the under ranked member extracted in the under ranked member extracting step (ST5) (ST8: a member processing instruction step).

In FIG. 18, next, in member management area 4, processing such as maintenance of cleaning of the member and adjustment of the member, updating of the evaluation information of the member, or the like is executed by the worker in accordance with an instruction printed by printer 45 of member management device 7 which acquires the processing instruction (processing instruction information Pmb), an instruction displayed on touch panel 13 of portable terminal 11 which acquires the processing instruction (processing instruction information Pmc) (ST9: a processing execution step). Therefore, the member rank of the under ranked member is the fitting member satisfying the request member rank.

In the number of the fitting members determining step (ST4), in a case where the required number of the fitting members for the production of the mounting board cannot be extracted (Yes in ST4), in a case where the processing execution step (ST9) is executed and the under ranked member is the fitting member, or the processing execution step (ST9) is expected to be executed, there is the required number of the fitting members for the production of the mounting board. Therefore, use member selector 51d selects the use member (use member information Isd (see FIGS. 14A, 14B, and 14C)) used for the production of the mounting board from the fitting members extracted in the fitting member extracting step (ST3) (ST10: a use member selecting step).

Next, member preparation instructing unit 51e generates an instruction (preparation instructing information Pea (see FIG. 15)) to prepare the use member selected in the use member selecting step (ST10) (ST11: a member preparation instructing step). Next, in member management area 4, preparation (dispensing) of the use member is executed by the worker in accordance with an instruction printed by printer 45 of member management device 7 which acquires the preparation instruction (preparation instructing information Peb), an instruction displayed on touch panel 13 of portable terminal 11 which acquires the preparation instruction (preparation instructing information Pec) (ST12: a preparation execution step). Therefore, the use member used for the production of the mounting board satisfying the request member rank by the member rank is prepared (dispensed).

In the member management method described above, the flow including the request rank determining step (ST2), the fitting member extracting step (ST3), the use member selecting step (ST10), the member preparation instructing step (ST11) is the member preparation method for preparing the use member. The member used for the production of the mounting board can be appropriately prepared by the member preparation method based on the required member rank.

In addition, in the member management method described above, the flow including the request rank determining step (ST2), the fitting member extracting step (ST3), the under ranked member extracting step (ST5), and the member processing instruction step (ST8) is the member preparing method for performing processing to satisfy the request member rank by the member rank of the under ranked member. The member can be processed at an appropriate timing by using the member for the production of the mounting board by the member processing method.

As described above, according to the disclosure, the member used for the production of the mounting board can be appropriately prepared.

The member preparation method and the member preparation apparatus of the disclosure have an effect that the member used for the production of the mounting board can be appropriately prepared.

Thereof it is useful in a component mounting field in which the component is mounted on the board.

What is claimed is:

1. A member preparation method comprising:
   a request rank determining step of determining a request member rank of a member fitted to production of a mounting board based on
      board information including a mounting position of a component to be mounted on the mounting board, and
      component information of the component to be mounted on the mounting board;
   a fitting member extracting step of extracting a fitting member fitted to the request member rank determined in the request rank determining step in a plurality of members based on
      a production plan of the mounting board, and
      retained member information in which a member rank is associated with each of the plurality of the members usable in the production of the mounting board;
   a use member selecting step of selecting a use member that is to be used for the production of the mounting board from the fitting member extracted in the fitting member extracting step; and
   a member preparation instructing step of generating an instruction to prepare the use member selected in the use member selecting step.

2. The member preparation method of claim 1,
   wherein the member rank is determined based on
   a member state rank that is set based on at least one of a cumulative use time of a member of the plurality of members, the number of times of maintenance, and an elapsed time after a last maintenance, and
   a member quality rank that is set based on at least one of an error rate of the member per the number of times of component mounting process, an error rate of the member per a use period, and evaluation information of the member.

3. The member preparation method of claim 1,
   wherein the member rank of the fitting member extracted in the fitting member extracting step is an expected member rank determined when the fitting member is prepared.

4. The member preparation method of claim 1,
   wherein the member is at least one of
   a suction nozzle that sucks the component,
   a mounting head, which is moved together with an installed suction nozzle, to mount the component on a board, and a component supplier that supplies the component to the mounting head.

5. The member preparation method of claim 1, wherein the component information is at least one of a type, a shape, and a size of the component.

6. The member preparation method of claim 1, wherein in the request rank determining step, the request member rank is determined based on an interval between the component to be mounted on the board and a component adjacent to the component.

7. A member preparation apparatus comprising:
a production information acquiring unit that acquires
   board information including a mounting position of a component to be mounted on a mounting board,
   component information of the component to be mounted on the mounting board, a production plan of the mounting board, and
   retained member information in which a member rank is associated with each of a plurality of members usable in production of the mounting board;
a request rank determination unit that determines a request member rank of a member fitted to production of the mounting board based on the board information and the component information acquired by the production information acquiring unit;
a fitting member extracting unit that extracts a fitting member fitted to the request member rank determined by the request rank determination unit in the plurality of members based on the production plan and the retained member information acquired by the production information acquiring unit;
a use member selector that selects a use member that is to be used for the production of the mounting board from the fitting member extracted by the fitting member extracting unit; and
a member preparation instructing unit that generates an instruction to prepare the use member selected by the use member selector.

8. The member preparation apparatus of claim 7, wherein the member rank is determined based on
   a member state rank that is set based on at least one of a cumulative use time of the member, the number of times of maintenance, and an elapsed time after a last maintenance, and
   a member quality rank that is set based on at least one of an error rate of the member per the number of times of component mounting process, an error rate of the member per a use period, and evaluation information of the member.

9. The member preparation apparatus of claim 7, wherein the member rank of the fitting member extracted by the fitting member extracting unit is an expected member rank determined when the fitting member is prepared.

10. The member preparation apparatus of claim 7, wherein the member is at least one of
   a suction nozzle that sucks the component,
   a mounting head, which is moved together with an installed suction nozzle, to mount the component on a board, and
   a component supplier that supplies the component to the mounting head.

11. The member preparation apparatus of claim 7, wherein the component information is at least one of a type, a shape, and a size of the component.

12. The member preparation apparatus of claim 7, wherein the request rank determination unit determines the request member rank based on an interval between the component to be mounted on the board and a component adjacent to the component.

* * * * *